(12) United States Patent
Nakata et al.

(10) Patent No.: US 8,952,371 B2
(45) Date of Patent: Feb. 10, 2015

(54) ORGANIC EL ELEMENT AND METHOD FOR MANUFACTURING SAME

(75) Inventors: Manabu Nakata, Osaka (JP); Chihaya Adachi, Fukuoka (JP); Yasukazu Nakata, Tokyo (JP)

(73) Assignees: Panasonic Corporation, Osaka (JP); Kyushu University, National University Corporation, Fukuoka (JP); LINTEC Corporation, Tokyo (JP)

( * ) Notice: Subject to any disclaimer, the term of this patent is extended or adjusted under 35 U.S.C. 154(b) by 0 days.

(21) Appl. No.: 13/997,729

(22) PCT Filed: Mar. 13, 2012

(86) PCT No.: PCT/JP2012/056451
§ 371 (c)(1),
(2), (4) Date: Jun. 25, 2013

(87) PCT Pub. No.: WO2012/132884
PCT Pub. Date: Oct. 4, 2012

(65) Prior Publication Data
US 2013/0277665 A1    Oct. 24, 2013

(30) Foreign Application Priority Data

Mar. 30, 2011  (JP) ................................ 2011-074431

(51) Int. Cl.
*H01L 51/50*    (2006.01)
*H01L 31/18*    (2006.01)
(Continued)

(52) U.S. Cl.
CPC ........ *H01L 51/5203* (2013.01); *H01L 51/5218* (2013.01); *H01L 51/56* (2013.01); *H01L 2251/5315* (2013.01); *H01L 2251/5369* (2013.01)

USPC ............. 257/40; 438/46; 438/22; 257/99; 257/E31.001

(58) Field of Classification Search
None
See application file for complete search history.

(56) References Cited

U.S. PATENT DOCUMENTS 7,034,470 B2 *  4/2006  Cok et al. ........................ 315/249
7,173,276 B2    2/2007  Choi et al.
(Continued)

FOREIGN PATENT DOCUMENTS

JP    2006-331694 A    12/2006
JP    2007-505465 A    3/2008
(Continued)

OTHER PUBLICATIONS

International Search Report for corresponding International Application No. PCT/JP2012/056451 mailed Jun. 26, 2012.
(Continued)

*Primary Examiner* — Sonya D McCall Shepard
(74) *Attorney, Agent, or Firm* — Renner, Otto, Boisselle & Sklar, LLP

(57) ABSTRACT

An organic EL element comprises: a substrate; a first electrode formed at one surface side of the substrate; a second electrode opposing the first electrode; and an organic EL layer located between the first and second electrodes. In the organic EL element, the second electrode is a transparent electrode, and the first electrode is a reflecting electrode. The organic EL element is a top-emission type. The first electrode comprises a plurality of nanometer-size (nanometer-order) columnar structures formed on the above-mentioned one surface of the substrate, and each of the plurality of columnar structures has a metallic surface as the outermost surface.

6 Claims, 3 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 7,462,774 B2 * | 12/2008 | Roscheisen et al. | 136/256 |
| 8,304,788 B2 | 11/2012 | Fukuda | |
| 2005/0029538 A1 | 2/2005 | Choi et al. | |
| 2009/0266418 A1 * | 10/2009 | Hu et al. | 136/260 |
| 2011/0101386 A1 | 5/2011 | Fukuda | |
| 2011/0193116 A1 | 8/2011 | Fukuda | |
| 2013/0153861 A1 * | 6/2013 | Kaminska et al. | 257/40 |

FOREIGN PATENT DOCUMENTS

| | | |
|---|---|---|
| JP | 2009-140915 A | 6/2009 |
| JP | 2010-257573 A | 11/2010 |

OTHER PUBLICATIONS

Form PCT/ISA/237 for corresponding International Application No. PCT/JP2012/056451 dated Jun. 26, 2012.

* cited by examiner

ORGANIC EL ELEMENT AND METHOD FOR MANUFACTURING SAME

TECHNICAL FIELD

The present invention relates to an organic EL element (an organic electroluminescence element) and a method for manufacturing same.

BACKGROUND ART

Conventionally, there has been proposed an organic EL element that has a configuration as shown in FIG. 6 (see Japanese Patent Application Laid-Open No. 2006-331694). In this organic EL element, one electrode (a cathode) 11 is laminated on a surface of a substrate 14, and an emission layer 13 is laminated on a surface of the electrode 11 while inserting an electron-injection/transport layer 15 therebetween, and the other electrode (an anode) 12 is laminated on the emission layer 13 while inserting a hole-injection/transport layer 16 therebetween. Then, the organic EL element is further provided at the above-mentioned surface side of the substrate 14 with a sealing member 17. Accordingly, in the organic EL element, light emitted by the emission layer 13 is radiated through the electrode 12 formed as a transparent electrode and the sealing member 17 formed of a transparent body.

Examples of materials for the electrode 11 having reflectivity include Al, Zr, Ti, Y, Sc, Ag, In, and the like. Then, examples of materials for the electrode 12 being an optically-transparent electrode include Indium-Tin Oxide (ITO), Indium-Zinc Oxide (IZO) and the like.

Generally, light extraction efficiency for an organic EL element is about 20% to 30%. Therefore, in the field of the organic EL element, it is desired that external quantum efficiency is improved for top-emission and bottom-emission types of any organic EL elements. Similarly, for the organic EL element having the configuration as shown in FIG. 6, it is desired that the light extraction efficiency is improved.

DISCLOSURE OF THE INVENTION

It is an object of the present invention to provide an organic EL element and a method for manufacturing same, which can improve light extraction efficiency.

An organic EL element of the invention comprises: a substrate; a first electrode formed at one surface side of the substrate; a second electrode opposing the first electrode; and an organic EL layer located between the first and second electrodes, wherein the second electrode is a transparent electrode, and the first electrode is a reflecting electrode, and wherein the first electrode comprises a plurality of nanometer-size columnar structures formed on the one surface of the substrate, and each of the plurality of columnar structures has a metallic surface as the outermost surface.

According to the organic EL element of the invention, light extraction efficiency can be improved.

In the organic EL element, preferably, each of the plurality of columnar structures has a height less than a film thickness of the organic EL layer.

In the organic EL element, preferably, a pitch between two adjacent columnar structures, among the plurality of columnar structures, is longer than a height of each of the plurality of columnar structures.

In the organic EL element, preferably, the substrate is provided at the one surface side with a conductive layer formed in a projection area for a thickness direction of the first electrode, and the conductive layer being electrically connected to the first electrode.

In the organic EL element, preferably, each of the plurality of columnar structures comprises: a core formed of a first organic semiconductor material; a columnar body formed of a second organic semiconductor material, and selectively installed upright on the core; and a first metallic thin film covering the core and the columnar body installed upright on the core, wherein the first electrode comprises: first metallic thin films of the plurality of columnar structures; and a second metallic thin film formed on the one surface of the substrate so as to be continuously coupled to the first metallic thin films, and wherein the first metallic thin films and the second metallic thin film are formed of the same materials.

In the organic EL element, preferably, the substrate is provided at the one surface side with a conductive layer formed in a projection area for a thickness direction of the first electrode, and the conductive layer being electrically connected to the first electrode.

A method for manufacturing the organic EL element of the invention, comprises: forming, at the one surface side of the substrate, the first electrode, the organic EL layer, and the second electrode sequentially; forming cores of the plurality of columnar structures at the one surface side of the substrate, and then forming columnar bodies of the plurality of columnar structures, and then forming the first and second metallic thin films, in order to form the first electrode; and heating, under inert gas atmosphere, a vapor-deposited film formed of the first organic semiconductor material at the one surface side of the substrate using a vacuum deposition method, thereby dispersing the vapor-deposited film as a cluster, in order to form the cores.

According to the method of the invention, the organic EL element can be provided in which light extraction efficiency can be improved.

In the method for manufacturing the organic EL element, preferably, forming of the columnar bodies is performed using a crystal growth method.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

Figure 1:
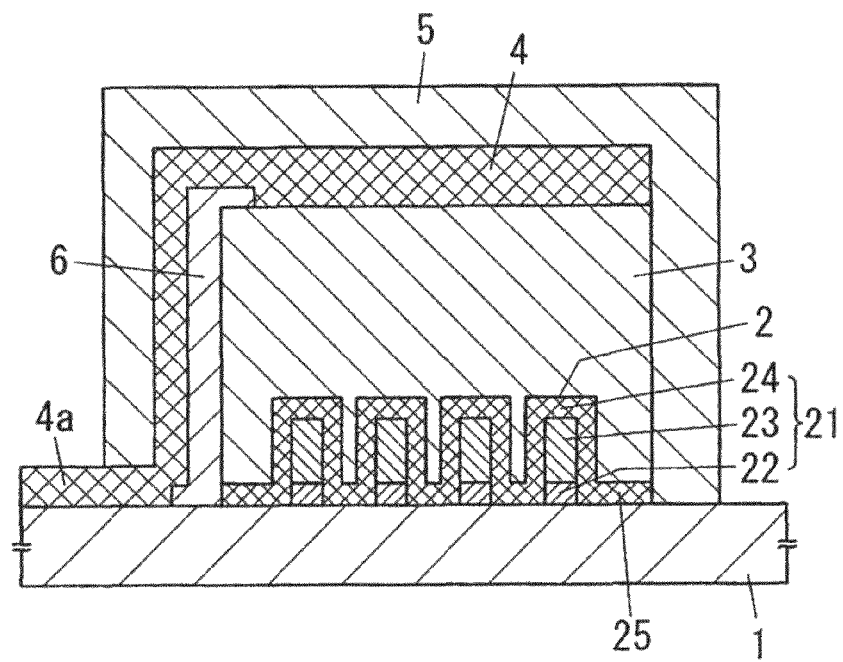
FIG. 1 is a schematic cross-section drawing of an organic EL element according to an embodiment of the present invention.

As shown in FIG. 1, an organic EL element according to the present embodiment includes: a substrate 1; a first electrode 2 formed at one surface side of the substrate 1; a second electrode 4 opposing the first electrode 2; and an organic EL layer 3 located between the first and second electrodes 2, 4. Further, the organic EL element includes a surface protection layer 5, which covers, at the above-mentioned one surface side of the substrate 1, a laminated body configured by the first electrode 2, the organic EL layer 3 and the second electrode 4.

Further, the organic EL element is provided on the above-mentioned one surface of the substrate 1 with: an external connection electrode (not shown) electrically connected to the first electrode 2; and an external connection electrode 4a electrically connected to the second electrode 4. Further, the organic EL element is provided at the above-mentioned one surface side of the substrate 1 with an insulation film 6, which is formed over the above-mentioned one surface of the substrate 1, a lateral side of the first electrode 2 and a lateral side of the organic EL layer 3, and electrically insulates the second electrode 4 from the first electrode 2.

The second electrode 4 is a transparent electrode and the first electrode 2 is a reflecting electrode. Thus, the organic EL element according to the present embodiment is a top-emission type.

The first electrode 2 has a plurality of nanometer-size (nanometer-order) columnar structures 21 formed on the above-mentioned one surface of the substrate 1, and each of the plurality of columnar structures 21 has a metallic surface as the outermost surface (In FIG. 1, only four columnar structures 21 are shown in the interest of brevity).

Each columnar structure 21 includes: a core 22 formed of a first organic semiconductor material; a columnar body 23 formed of a second organic semiconductor material, and selectively installed upright on the core 22; and a first metallic thin film 24 covering the core 22 and the columnar body 23 installed upright on the core 22. The first electrode 2 includes: first metallic thin films 24 of the plurality of columnar structures 21; and a second metallic thin film 25 formed on the above-mentioned one surface of the substrate 1 so as to be continuously coupled to the first metallic thin films 24. The first metallic thin films 24 and the second metallic thin film 25 are formed of the same materials.

The first electrode 2 will be explained below as an electrode including the first metallic thin films 24 being parts of columnar structures 21, and the second metallic thin film 25, without including the core 22 and columnar body 23. However, in regard to the definition of the first electrode 2, if not only the outermost surface of each columnar structure 21 but also the whole of each columnar structure 21 are formed of one metallic material, the whole of each columnar structure 21 may be included in the first electrode 2.

Hereinafter, each composition element of the organic EL element will be explained in detail.

The substrate 1 has a rectangle in the planar view, but the shape is not limited in particular, and may be a circle, a triangle, a pentagon or a hexagon for example.

The substrate 1 can be provided using for example: a glass substrate formed of soda glass, alkali-free glass or the like; a plastic substrate formed of polycarbonate, polyethylene terephthalate or the like; or a metal substrate formed of aluminum, copper, stainless or the like. When a metal substrate is used as the substrate 1, the above-mentioned insulation film 6 may be extended properly, in order to prevent short circuit from being generated between the first electrode 2 and the second electrode 4, at the above-mentioned one surface side of the substrate 1. Further, the first electrode 2 and the substrate 1 may be electrically connected to each other, or may not be electrically connected to each other. In the case where it is not desired that the first electrode 2 and the substrate 1 are electrically connected to each other, an insulation layer (not shown) may be located between there. Material of the substrate 1 is not limited to the above-mentioned materials.

As materials for the first and second metallic thin films 24, 25 in the first electrode 2, aluminum, silver, or compound including those metals can be adopted. However, the first and second metallic thin films 24, 25 may be configured as a laminated structure or the like formed with combination of aluminum and other electrode materials. Examples of combination of such electrode materials include: a laminated body including an alkali metal thin film and an aluminum thin film; a laminated body including an alkali metal thin film and a silver thin film; a laminated body including an alkali metal halogen compound thin film and an aluminum thin film; a laminated body including an alkali metal oxide thin film and an aluminum thin film; a laminated body including an alkali earth metal or rare earth metal thin film and an aluminum thin film; and an alloy of those metal species and other metals, or the like. Specifically, examples of the combination include: a laminated body including an aluminum thin film, and a thin film, such as a sodium thin film, a sodium-potassium alloy thin film, a lithium thin film or a magnesium thin film; a laminated body including an aluminum thin film, and a thin film, such as a magnesium-silver mixture thin film, a magnesium-indium mixture thin film, an aluminum-lithium alloy thin film or a lithium fluoride thin film; and a laminated body including an aluminum thin film and an aluminum oxide thin film. The first and second metallic thin films 24, 25 can be formed by the vacuum deposition method, the sputtering method, or the like for example. Materials for the cores 22 and the columnar bodies 23 of the columnar structures 21 will be described below.

Examples of materials for the second electrode 4 include: fine grains of metal, such as silver or gold; fine grains of metal, such as Indium-Tin Oxide (ITO), Indium-Zinc Oxide (IZO) or Tin Oxide; conducting polymers; an organic material having conductivity; an organic material including dopant (donor or acceptor); a mixture of a conductive body and conductive organic materials (including high-polymer materials); and a mixture of those conductive materials and non-conductive materials. However, the materials are not limited to those examples. Then, examples of non-conductive materials include acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, diacrylic phthalate resin, cellulosic resin, polyvinyl chloride, polyvinylidene chloride, polyvinyl acetate, the other thermoplastic resins, and copolymer made of two or more types of monomers that constitute those resins. However, the non-conductive materials are not limited to those examples. In order to enhance conductivity, doping may be performed using the following dopant. Examples of dopants include sulfone acid, Lewis acid, protic acid, alkali metal, alkali earth metal and the like. However, the dopants are not limited to those examples. The second electrode 4 can be formed by the sputtering method, the vacuum deposition method, the coating method, or the like for example.

In the organic EL element, the first electrode 2 is a cathode, and the second electrode 4 is an anode. Then, in the organic EL element, the organic EL layer 3, which is located between the first and second electrodes 2, 4, is provided with an emission layer also serving as an electron-transport layer, and a hole-transport layer, in order from the first electrode 2 side.

The laminated structure of the organic EL layer 3 is not limited to the above-mentioned example. Examples of laminated structures include: a single layer structure of the emission layer; a laminated structure of the emission layer and the hole-transport layer; a laminated structure of the electron-transport layer, the emission layer and the hole-transport layer; and a laminated structure of the emission layer and the electron-transport layer. Further, a hole-injection layer may be located between the second electrode 4 and the hole-transport layer. Further, the emission layer may have a single layer structure or may have a multi-layer structure. For example, when intended emission color is white, three types of dopant pigments may be doped into the emission layer: red, green and blue. Or, the emission layer may have a laminated structure including a blue hole-transporting emission layer, a green electron-transporting emission layer and a red electron-transporting emission layer, or may have a laminated structure including a blue electron-transporting emission layer, a green electron-transporting emission layer and a red electron-transporting emission layer. Or, a multi-unit structure may be adopted, in which a plurality of light emitting units are laminated, through interlayers having optical transparency and conductive property, to be electrically connected in series (that is, the structure including the plurality of light emitting units that are laminated in the thickness direction between a single first electrode 2 and a single second electrode 4). In this case, each of the plurality of light emitting units is the organic EL layer 3 that has a function emitting light when voltage is applied while being sandwiched between the first and second electrodes 2, 4.

As materials for the emission layer, arbitrary materials known as materials for an organic EL element can be used. Examples of this kind of materials include: polyparaphenylene vinylene derivatives; polythiophene derivatives; polyparaphenylene derivatives; polysilane derivatives; polyacetylene derivatives or the like; polyfluorene derivatives; polyvinyl carbazole derivatives; plastids; highly-polymerized metal complex series emitting materials or the like; anthracene; naphthalene; pyrene; tetracene; coronene; perylene; phthalo perylene; naphthalo perylene; diphenyl butadiene; tetraphenyl butadiene; coumalin; oxadiazole; bis-benzo-xazoline; bis-styryl; cyclopentadiene; coumalin; oxa-diazole; bis-benzo-xazoline; bis-styryl; cyclopentadiene; quinoline metal complex; tris(8-hydroxyquinolinate) aluminum complex; tris(4-methyl-8-quinolinate) aluminum complex; tris(5-phenyl-8-quinolinate) aluminum complex; amino quinoline metal complex; benzo quinoline metal complex; tri-(p-terphenyl-4-yl)amine; Piran; quinacridone; rubrene; drrivatives thereof; 1-aryl-2,5-di(2-thienyl) pyrrole derivatives; distyryl benzene derivatives; styrylarylene derivatives; styrylamine derivatives; and compounds having groups including luminescent compounds thereof as part of the molecule or the like. Further, not only compounds derived from fluorescent dyes as represented by the above-mentioned compounds, but also so-called phosphorescent material, light emitting material, such as Indium complexes, Osmium complexes, Platinum complexes and europium complexes, or compound or high molecular having those in the molecule can be suitably used. These materials can be selected suitably, as needed. The emission layer may be formed by using the dry-type process, such as the vacuum deposition method or the transfer method, or may be formed by using the wet-type process, such as the spin coating method, the spray coating method, the die coating method or the gravure printing method.

As materials for the hole-transport layer, materials from low-polymer to high-polymer, which have small LUMO (Lowest Unoccupied Molecular Orbital) level, can be used. Examples of the materials include polymer and the like that include aromatic amine, and, for example, include polyarylene derivatives and the like having aromatic amine at the side chain or the main chain of polyvinyl carbazole (PVCz), polypyridine, polyaniline or the like, but the materials are not limited to these.

Further, examples of materials for the hole-transport layer include arylamine series compounds, amine compounds with carbazole groups, amine compounds with fluorene derivatives, and the like, and the representative examples include: 4,4'-bis[N-(naphthyl)-N-phenyl-amino]biphenyl (α-NPD); N,N'-bis(3-methyl phenyl)-(1,1'-biphenyl)-4,4'-diamine (TPD); 2-TNATA; 4,4',4''-tris(N-(3-methyl phenyl) N-phenyl-amino)triphenyl amine (MTDATA); 4,4'-N,N'-dicarbazole biphenyl (CBP); Spiro-NPD; spiro-TPD; spiro-TAD; and TNB. The hole-transport layer may be formed by using the dry-type process, such as the vacuum deposition method or the transfer method, or may be formed by using the wet-type process, such as the spin coating method, the spray coating method, the die coating method or the gravure printing method.

Examples of materials for the hole-injection layer include organic materials including thiophene, triphenylmethane, hydrazoline, arylamine, hydrazone, stilbene, triphenylamine, and the like. The examples include, specifically, aromatic amine derivatives, such as polyvinyl carbazole (PVCz), poly-ethylenedioxythiophene:polystyrenesulfonate (PEDOT:PSS), TPD, and the like. These materials may be used singly, or may be used with combination of two or more kinds of materials. Further, as materials for the hole-injection layer, CuPc, starburst amine or the like can be used for example. The hole-injection layer may be formed by using the dry-type process, such as the vacuum deposition method or the transfer method, or may be formed by using the wet-type process, such as the spin coating method, the spray coating method, the die coating method or the gravure printing method.

Examples of materials for the electron-transport layer include: metal complexes known as the electron-transport materials, such as Alga; and compounds having hetero ring, such as phenanthroline derivatives, pyridine derivatives, tetrazine derivatives and oxadiazole derivative. However, the examples are not limited to those, and then the arbitrary electron-transport materials known generally can be used. The electron-transport layer may be formed by using the dry-type process, such as the vacuum deposition method or the transfer method, or may be formed by using the wet-type process, such as the spin coating method, the spray coating method, the die coating method or the gravure printing method.

Examples of materials for the electron-injection layer include: metal halide, such as metal fluoride (for example lithium fluoride, magnesium fluoride and the like) and metal chloride (for example represented by sodium chloride, magnesium chloride and the like); and oxide, nitride, carbide and oxynitride of metals of various kinds, such as aluminum, cobalt, zirconium, titanium, vanadium, niobium, chromium, tantalum, tungsten, manganese, molybdenum, ruthenium, iron, nickel, copper, gallium, zinc, and silicon. Specifically, the examples include: insulators, such as aluminum oxide, magnesium oxide, iron oxide, aluminum nitride, silicon nitride, silicon carbide, silicon oxynitride and boron nitride; silicon compounds, such as $SiO_2$ and SiO; and carbon compounds. The material can be selected randomly from those. The electron-injection layer may be formed by using the vacuum deposition method, the sputtering method or the like for example.

As material for the insulation film 6, polyimide is used for example, but the material is not limited to that. For example, novolak resin, epoxy resin or the like can be adopted.

For the surface protection layer 5, the material with the optical transparency and the gas barrier property should be adopted. For example, fluorine series compound, fluorine series high polymer, the other organic molecule, high polymer material or the like should be adopted. The surface protection layer 5 can be also formed as film structure or plated structure with the optical transparency and the gas barrier property. In the former case, the periphery should be fixed on the above-mentioned one surface of the substrate 1 by using the vacuum laminating method for example. In the latter case, the periphery should be fixed on the above-mentioned one surface of the substrate 1 with sealing agent (adhesive), such as ultraviolet curable resin.

Preferably, heights of the columnar structures 21 are set to be the same and pitches between two adjacent columnar structures 21 are set to be the same (that is, the columnar structures 21 are located periodically), when the peculiar wavelength dependency and outputting angle dependency are desired. On the other hand, preferably, the heights and pitches are set to be random, when it is desired that the light extraction efficiency is improved as equally as possible for light having broad wavelength band and all outputting angles. Further, preferably, each of the columnar structures 21 has a height less than a film thickness of the organic EL layer 3, thereby preventing short circuit from being generated between the first electrode 2 and the second electrode 4. For example, when the organic EL layer 3 has the film thickness of about 20 nm to 400 nm, the height of each of the columnar structures 21 is preferably set to about 10 nm to 200 nm. Then, the pitch between two adjacent columnar structures 21 is preferably longer than the height of each of the columnar structures 21, thereby preventing plasmon loss and then being able to improve the light extraction efficiency.

The core 22 and columnar body 23 have circle shapes when viewed from the plane surfaces, however, shapes thereof are not limited to circles. For example, the core 22 and columnar body 23 may have polygonal shapes. Here, the grain diameter of the core 22 should be set to nanometer-size (nanometer-order) when viewed from the plane surface, and should be set to fpm or less. In this regard, it is necessary to set the grain diameter of the core 22 in the planar view so that the columnar structure 21 has nanometer-size. Here, the grain diameter of the core 22 in the planar view, the size of the columnar body 23, and the size of the columnar structure 21 should be measured by using the atomic force microscope (AFM) for example. The following materials can be used as the first and second organic semiconductor material for the core 22 and columnar body 23: phthalocyanine series pigments; indigo series pigments; thioindigo series pigments; quinacridone series pigments; merocyanine compounds; cyanine compounds; squarium compounds; polyaromatic compounds; charge-transfer agents used in the organic electrophotographic photoreceptor; electroconductive organic charge-transfer complexes; and conductive polymers.

Examples of the above-mentioned phthalocyanine series pigments include: phthalocyanine having, as the central metal, bivalent metal, such as copper, zinc, cobalt, nickel, lead, platinum, iron, or magnesium; phthalocyanine having trivalent metal, in which the halogen atom is coordinated, such as metal-free phthalocyanine, aluminum chloro phthalocyanine, indium chloro phthalocyanine or gallium chloro phthalocyanine; and phthalocyanine, in which oxygen is coordinated, such as vanadyl phthalocyanine or titanyl phthalocyanine. However, the examples are not limited to those phthalocyanines.

Examples of the above-mentioned polyaromatic compounds include anthracene, tetracene, pentacene, perylene, derivatives thereof and the like, but are not limited to those in particular. Then, examples of the above-mentioned charge-transfer agents include hydrazone compounds, pyrazoline compounds, triphenylmethane compounds, triphenylamine compounds and the like, but are not limited to those.

Examples of the above-mentioned electroconductive organic charge-transfer complexes include tetrathiofulvalene, tetraphenyl tetrathiofulvalene and the like, but are not limited to those. Examples of the above-mentioned conductive polymers donating electron include poly(3-alkylthiophene), polyparaphenylenevinylene derivatives, polyfluorene derivatives, thiophene series polymer, oligomer of conductive polymer and the like, which are soluble in organic solvents, but are not limited to those.

The cores 22 and the columnar bodies 23 described above are formed of materials which differ from each other, from among the above-mentioned organic semiconductor materials of various kinds, however, materials thereof are not limited to such different materials, and those may be formed of the same materials. As a method of forming the cores 22, the vacuum deposition method is adopted, however, the formation method is not limited to that and for example the spin coating method, Langmuir-Blodgett (LB) method or the like may be adopted. That is, as long as the core 22 can be formed into intended shape, the formation method is not limited. However, in the case where the cores 22 are formed by the spin coating method, there are some problems that the influence of impurity is large, the restriction of material is large, the uniformity for the in-plane distribution of the cores 22 is low, and the like. Also, in the case where the cores 22 are formed by LB method, there are problems that the influence of impurity is large, the restriction of material is large, and the like. On the other hand, if the cores 22 are formed by the vacuum deposition method, there are advantages that: the influence of impurity becomes less; because any materials can be adopted as long as the material sublimates under vacuum, the restriction of material becomes small; and the uniformity for the in-plane distribution of the cores 22 becomes high.

Further, if the cores 22 are formed by the vacuum deposition method, the grain diameters or the like of the cores 22 can be controlled through: the type of the first organic semiconductor material; the vapor deposition film thickness; annealing before and after the formation of the cores 22; the temperature (substrate temperature) of the substrate 1 upon forming the cores 22; and the deposition rate for the formation of the cores 22. When the cores 22 are formed in the resistance heating vacuum deposition equipment, using the vacuum deposition method, the grain diameters of the cores 22 can be changed through changing the substrate temperature within the range of 80 to 180 degrees C. for example, and can be increased with an increase in the substrate temperature. Further, when the cores 22 can be formed in the resistance heating vacuum deposition equipment, the pitch between two adjacent cores 22 can be lengthened through increasing the substrate temperature more (that is, the density of the cores 22 per unit area can be reduced).

Examples of methods of forming the columnar bodies 23 include: Physical Vapor Transport crystal growth method that is performed in a silica tube, the internal space of which is vacuated; the crystal growth method that is performed in solution or under atmosphere; and a method, in which the vapor-deposited film, which has been formed of the second organic semiconductor material (the material for the columnar bodies 23) by the vacuum deposition method after the formation of each core 22, is heated under inert gas atmosphere (for example, $N_2$ gas atmosphere), thereby dispersing the vapor-deposited film as a cluster and agglutinating those on the cores 22. However, as long as the columnar bodies 23 can be selectively formed only on the cores 22, the method of forming is not limited to those. For example, in the case where the columnar bodies 23 are formed in the sublimation refiner by using Physical Vapor Transport crystal growth method being a type of the crystal growth method, the heights of the columnar bodies 23 can be changed through changing the temperature (substrate temperature) of the substrate 1 within the range of 80 to 200 degrees C. for example upon forming the columnar bodies 23. The heights can be increased with an increase in the substrate temperature.

The materials for the cores 22 and columnar bodies 23 are not limited to the first and second organic semiconductor materials. For example, metal may be used for the materials.

Preferably, the columnar bodies 23 are respectively formed on the cores 22 so as to extend along a normal direction to the above-mentioned one surface of the substrate 1. The columnar bodies 23 have circular cylindrical shapes, but the shapes are not limited in particular. For example, in the column's shape, the diameter of the upper surface may be set so as to be different from that of the lower surface. Further, the columnar bodies 23 may have polygonal column's shapes.

Preferably, an aspect ratio of the columnar body 23 is set so as not to exceed ten, in order to prevent the columnar body 23 from bending beneath its own weight and falling. In this case, the aspect ratio is a value obtained by dividing the length (height) of the columnar body 23 by the maximum grain diameter of the columnar body 23 in the cross-section surface perpendicular to the longitudinal direction of the columnar body 23.

Figure 2:
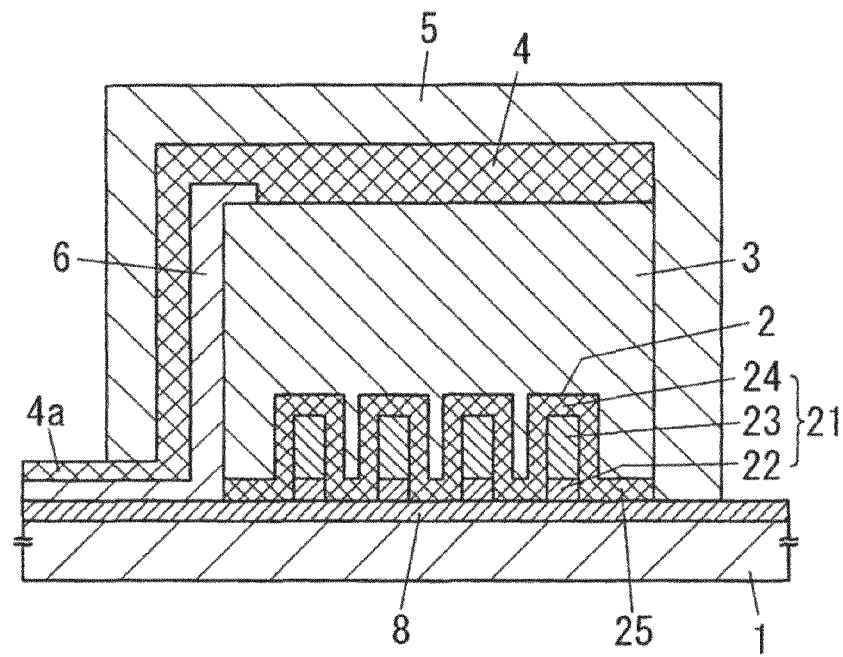
FIG. 2 is a schematic cross-section drawing of another configuration example in the organic EL element according to said embodiment of the present invention.

In the above-mentioned organic EL element, the film thicknesses of the first and second metallic thin films 24, 25 are restricted upon forming the nanometer-size columnar structures 21. Therefore, reducing the resistance of the first electrode 2 is restricted, and it is considered that this becomes a factor for an increase in the in-plane brightness variation when increasing the area of the organic EL element. On the other hand, for example, as shown in FIG. 2, the substrate 1 is provided at the above-mentioned one surface side with a conductive layer 8 formed, as an auxiliary electrode, in a projection area for the thickness direction of the first electrode 2. The conductive layer 8 is electrically connected to the first electrode 2. By using the conductive layer 8, the in-plane brightness uniformity can be enhanced. The conductive layer 8 may be formed over the length and the breadth of the projection area, or may be formed on a part of the projection area, or may be formed over the length and the breadth of the projection area and the adjacent areas. The conductive layer 8 may be formed of the same material as the first and second metallic thin films 24, 25, or may be formed of the different material from those films 24, 25. Or, a conductive substrate may be used for the substrate 1, without the conductive layer 8.

As a method for manufacturing the organic EL element according to the present embodiment, the first electrode 2, the organic EL layer 3 and the second electrode 4 are formed at the above-mentioned one surface side of the substrate 1, sequentially. In order to form the first electrode 2, the method for manufacturing is considered, in which the cores 22 are formed at the above-mentioned one surface side of the substrate 1, and then the columnar bodies 23 are formed, and then the first and second metallic thin films 24, 25 are formed. In this case, in order to form the cores 22, for example, a vapor-deposited film, which has been formed of the first organic semiconductor material at the above-mentioned one surface side of the substrate 1 using the vacuum deposition method, is heated under inert gas atmosphere, thereby dispersing the vapor-deposited film as a cluster and being able to form the cores 22. The columnar bodies 23 can be formed by using the crystal growth method. In the case where the cores 22 are formed by using the vacuum deposition method, for example, the deposition of the first organic semiconductor material may be performed through an opening of a shadow mask (for example, a stainless-steel mask), which defines a formation area for a group of numerous cores 22 on the above-mentioned one surface of the first electrode 2.

As an Example 1, an organic EL element was manufactured using: a glass substrate as the substrate 1; 3,4,9,10-perylenetetracarboxylic dianhydride (PTCDA) and copper phthalocyanine as the first organic semiconductor material for the cores 22; copper phthalocyanine as the second organic semiconductor material for the columnar bodies 23; aluminum as the materials for the first and second metallic thin films 24, 25; Alga as the material for the emission layer that also serves as the electron-transport layer; α-NPD as the material for the hole transport layer; and ITO as the material for the second electrode 4.

In order to manufacture the organic EL element of the Example 1, the substrate 1 of a glass substrate was prepared, and then the respective ultrasonic cleanings were performed for 10 minutes, using detergent, ion-exchange water, ion-exchange water, acetone, acetone and isopropyl alcohol, as a preprocessing for forming the cores 22. Then, the substrate 1 was cleaned with isopropyl alcohol vapor, and was then dried. After that, a surface cleaning processing was performed for 10 minutes using a UV ozone washer.

After the above surface cleaning processing, the cores 22 were formed by using the vacuum deposition method. Specifically, while keeping the vacuum in a chamber of the resistance heating vacuum deposition equipment below $1\times10^{-3}$ Pa, PTCDA and copper phthalocyanine were evaporated by the resistance heating, and then PTCDA and copper phthalocyanine were deposited until the respective vapor-deposited film thicknesses (average film thicknesses) measured by a crystal oscillator reached 3 nm, 3 nm. In this way, the numerous cores 22 were formed. The vapor deposition of PTCDA and the vapor deposition of copper phthalocyanine were performed through an opening of a stainless-steel mask, which defines a formation area for a group of the numerous cores 22 on the above-mentioned one surface of the first electrode 2.

The columnar bodies 23 were formed by Physical Vapor Transport crystal growth method being a kind of crystal growth method. Specifically, first, the substrate 1, on which the numerous cores 22 were formed, was located together with a copper phthalocyanine powder in a growth furnace formed of the silica tube of the sublimation refiner. In this case, the copper phthalocyanine powder was located in a heating section heated by a first heater, and the substrate 1, on which the numerous cores 22 were formed, was located in a growth section heated by a second heater. Next, the vacuum in the growth furnace was set to about $1 \times 10^{-2}$ Pa, and then the first and second heaters were controlled to set the temperature of the heating section located at the upstream in the growth furnace to 380 degrees C. and to set the temperature of the growth section located at the downstream to 180 degrees C. Here, when the heating section started applying current to the first heater and then the temperature of the heating section reached 380 degrees C. being a target temperature, the heating section stopped applying current to the first heater to return the temperature to room temperature. In this way, the columnar bodies 23 were formed. When measuring the shape of the columnar body 23 formed under the same conditions, using the atomic force microscope, the grain diameter in the planar view was about 80 nm and the height was about 40 nm.

The first and second metallic thin films 24, 25 were formed by using the vacuum deposition method. Specifically, while keeping the vacuum in the chamber of the resistance heating vacuum deposition equipment below $1 \times 10^{-3}$ Pa, aluminum was evaporated by the resistance heating and then aluminum was deposited until the vapor-deposited film thickness (average film thickness) measured by the crystal oscillator reached 35 nm. In this way, the first and second metallic thin films 24, 25 were simultaneously formed. Therefore, the columnar structures 21 were formed. When measuring the shape of the columnar structure 21 formed under the same conditions, using the atomic force microscope, the grain diameter in the planar view was about 100 nm and the height was about 60 nm.

In the organic EL layer 3, the emission layer also serving as the electron-transport layer, and the hole-transport layer were formed by the vacuum deposition method. Specifically, while keeping the vacuum in the chamber of the resistance heating vacuum deposition equipment below $1 \times 10^{-3}$ Pa, Alq$_3$ and α-NPD were evaporated by the resistance heating and then Alq$_3$ and α-NPD were deposited until the respective vapor-deposited film thicknesses (average film thicknesses) measured by the crystal oscillator reached 50 nm, 50 nm. In this way, the organic EL layer 3 was formed.

The second electrode 4 was formed by the sputtering method. Specifically, as the second electrode 4, an ITO film with the film thickness of 25 nm was formed using RF sputtering device.

The insulation film 6 was formed by applying polyimide to the whole surface of the above-mentioned one surface side of the substrate 1 using the spin coating method and then by patterning using Photolithography technique.

In order to form the surface protection layer 5, first, the substrate 1, in which the formation to the second electrode 4 was completed, was carried into a glove box filled with a dry nitrogen atmosphere having a dew point of −76 degrees C. or less, without being exposed to atmosphere. On the other hand, a getter, into which calcium oxide was kneaded as water absorption materials, was attached to a glass sealing plate with an adhesive, and a sealing agent made of ultraviolet curing resin was previously applied to the periphery of the sealing plate, and in the glove box the sealing plate was pasted to the substrate 1 through the sealing agent, and curing of the sealing agent was performed with UV. In this way, the surface protection layer 5 as the sealing plate having the plate-like structure was formed.

As an Example 2, an organic EL element was manufactured so as to have the same structure as the Example 1. The organic EL element of the Example 2 is different from that of the Example 1 in that the columnar bodies 23 made of copper phthalocyanine were formed by using the following method: the vapor-deposited film formed of the second organic semiconductor material by the vacuum deposition method was heated under inert gas atmosphere (in this case, N$_2$ gas atmosphere), thereby dispersing the vapor-deposited film as a cluster and agglutinating those on the cores 22.

In order to manufacture the organic EL element of the Example 2, in the formation process of the columnar bodies 23, the vapor-deposited film was formed by the vacuum deposition method and the substrate 1 was then carried into the glove box and was heated using a hot plate under N$_2$ gas atmosphere, thereby dispersing the vapor-deposited film as a cluster and agglutinating those thermally. In this way, the columnar body 23 made of copper phthalocyanine was selectively formed only on each core 22.

As a Comparative Example 1, an organic EL element was manufactured so as to have substantively the same structure as the Example 1. However, the organic EL element of the Comparative Example 1 is different from that of the Example 1 only in that the first electrode 2 was formed as an aluminum film that has a film thickness of 35 nm and a flat surface.

Like the Example 1, the columnar bodies 23 formed by the crystal growth method have orientation, and thus have high crystallinity. On the other hand, the Example 2 is the same as the Example 1 except the method of forming the columnar bodies 23. The columnar bodies 23 in the Example 2 formed by the vacuum deposition method had polycrystal. Therefore, it was confirmed that the columnar bodies 23 in the Example 1 had higher crystallinity than that in the Example 2. It can be determined whether the method used for forming the columnar bodies 23 is the crystal growth method as the Example 1 or the vacuum deposition method as the Example 2, through observation of the cross-section shape and the surface shape using a field-emission type scanning electron microscope (FE-SEM), a transmission type electron microscope (TEM) or the like, or through crystalline evaluation obtained by an X-ray diffraction analysis (XRD) or the like. There are many organic semiconductor materials in which both methods can be easily distinguished.

Figure 3:
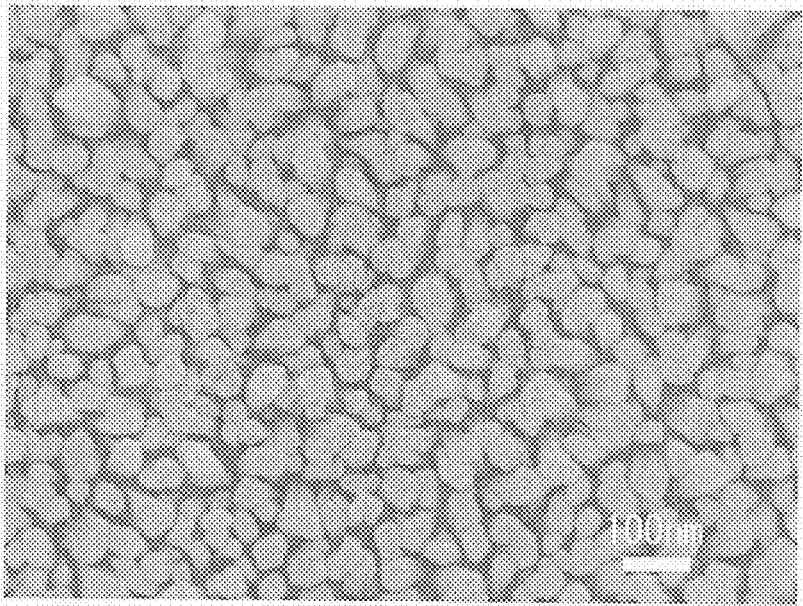
FIG. 3 is a surface observation picture of a sample in which columnar bodies were formed, obtained using a field-emission-type scanning electron microscope, in manufacturing process for the organic EL element according to said embodiment of the present invention.
Figure 4:
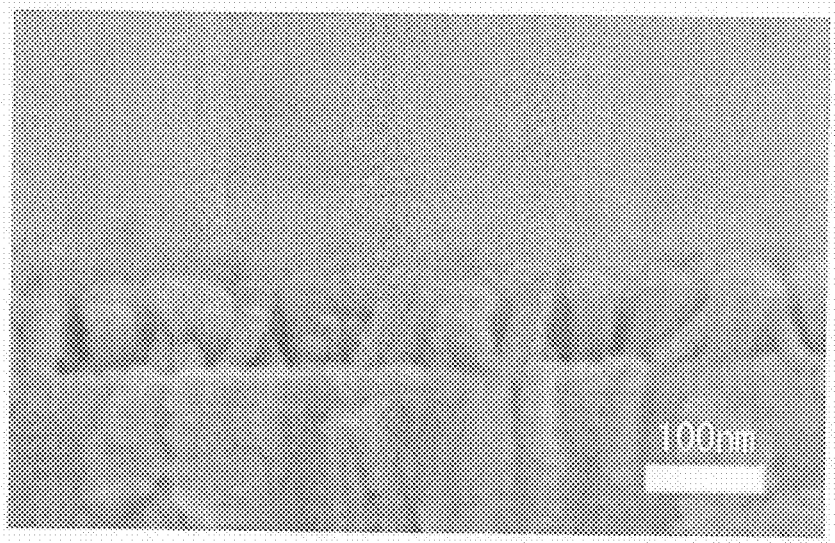
FIG. 4 is a cross-section observation picture of the sample in which the columnar bodies were formed, obtained using the field-emission-type scanning electron microscope, in manufacturing process for the organic EL element according to said embodiment of the present invention.
Figure 5:
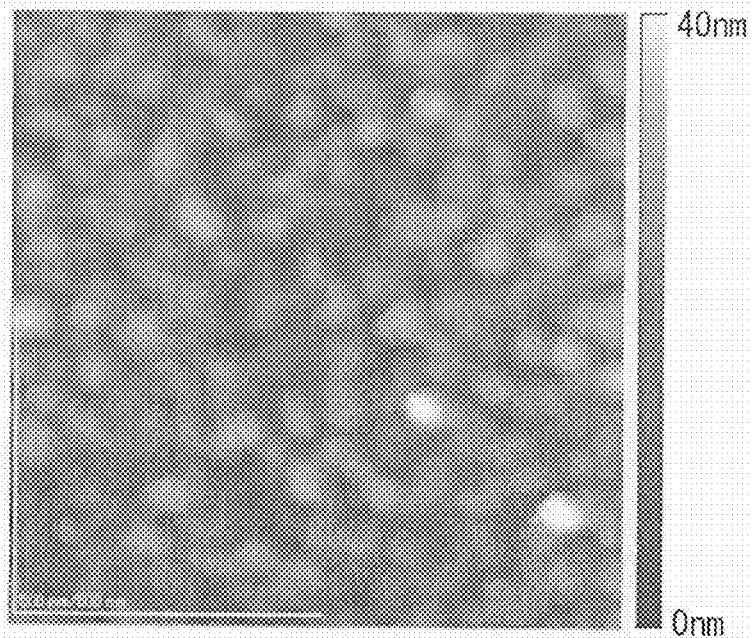
FIG. 5 is a surface observation picture of a sample in which a first electrode was formed, obtained using an atomic force microscope, in manufacturing process for the organic EL element according to said embodiment of the present invention.
Figure 6:
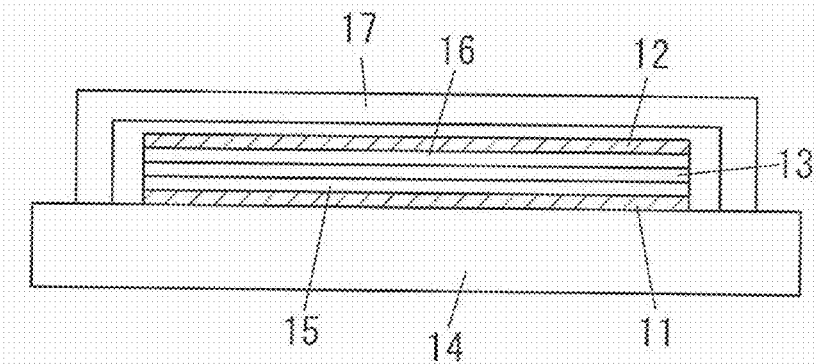
FIG. 6 is a schematic cross-section drawing of a conventional organic EL element.

Here, the respective FIGS. 3 and 4 show a surface observation picture (a surface SEM picture) and a cross-section observation picture (a cross-section SEM picture), obtained by observation of the columnar bodies 23 using the field-emission type scanning electron microscope (FE-SEM), in regard to a sample in which the formation process to the columnar bodies 23 was completed in the manufacturing process of the organic EL element of the Example 1. Then, FIG. 5 shows a surface observation picture (AFM picture), obtained by the surface observation using the atomic force microscope, in regard to a sample in which the formation process to the first and second metallic thin films 24, 25 was completed.

Then, for the organic EL elements of the Example 1 and Comparative Example 1, the emission properties were evaluated. In order to evaluate the emission properties, a constant current of 10 mA/cm$^2$ was supplied from a constant-current power supply to the organic EL elements, and emitted light intensities in the front directions of the organic EL elements were measured using a spectral apparatus (Multichannel Analyzer PMA-50 manufactured by Hamamatsu Photonics Corporation). The measured results are shown in the following Table 1. The Table 1 shows values in a case where the emitted light intensity in the Comparative Example 1 is standardized as 1.00.

| | EMITTED LIGHT INTENSITY |
|---|---|
| COMPARATIVE EXAMPLE 1 | 1.00 |
| EXAMPLE 1 | 1.05 |

As can be seen from the Table 1, the emitted light intensity in the Example 1 is higher than that in the Comparative Example 1. Therefore, it is considered that the light extraction efficiency for the organic EL element in the Example 1 is improved more than that in the Comparative Example 1.

The organic EL element according to the present embodiment, which was explained above, includes: the substrate 1; the first electrode 2 formed at the above-mentioned one surface side of the substrate 1; the second electrode 4 opposing the first electrode 2; and the organic EL layer 3 located between the first and second electrodes 2,4. The second electrode 4 is a transparent electrode, and the first electrode 2 is a reflecting electrode. Further, in the organic EL element according to the present embodiment, the first electrode 2 includes a plurality of nanometer-size columnar structures 21 formed on the above-mentioned one surface of the substrate 1, and each of the plurality of columnar structures 21 has a metallic surface as the outermost surface. Therefore, the organic EL element according to the present embodiment can improve the light extraction efficiency, compared with a case where the first electrode 2 has a flat surface. In the organic EL element according to the present embodiment, it is considered that reasons that the light extraction efficiency can be improved compared with a case where the metallic surface of the first electrode 2 (an interfacial surface between the first electrode 2 and the organic EL layer 3) is flat include: diffraction effect; and a reduction in the optical loss caused by the surface plasmon generated on the metallic surface of the first electrode 2.

Further, in the organic EL element according to the present embodiment, each of the plurality of columnar structures 21 has a height less than the film thickness of the organic EL layer 3. Therefore, short circuit generated between the first and second electrodes 2, 4 can be prevented.

Further, in the organic EL element according to the present embodiment, a pitch between two adjacent columnar structures 21 is longer than a height of each of the plurality of columnar structures 21. Thus, plasmon loss can be prevented and the light extraction efficiency can be improved.

Further, in the organic EL element according to the present embodiment, each of the plurality of columnar structures 21 includes: the core 22 formed of a first organic semiconductor material; the columnar body 23 formed of a second organic semiconductor material and selectively installed upright on the core 22; and the first metallic thin film 24 covering the core 22 and the columnar body 23 installed upright on the core 22. Further, the first electrode 2 includes: the first metallic thin films 24; and the second metallic thin film 25 formed on the above-mentioned one surface of the substrate 1 so as to be continuously coupled to the first metallic thin films 24. Further, the first metallic thin films 24 and the second metallic thin film 25 are formed of the same materials. Therefore, the organic EL element can prevent a reduction in electrical property of the first electrode 2 and can prevent an occurrence of the surface plasmon, compared with a case where the columnar structures 21 are formed of bulk metal objects.

As described above, in the method for manufacturing the organic EL element, the first electrode 2, the organic EL layer 3 and the second electrode 4 are formed sequentially, at the above-mentioned one surface side of the substrate 1. In this case, in order to form the first electrode 2, the cores 22 are formed at the above-mentioned one surface side of the substrate 1, and then the columnar bodies 23 are formed, and then the first and second metallic thin films 24, 25 are formed. Further, in order to form the cores 22, the vapor-deposited film formed of the first organic semiconductor material at the above-mentioned one surface side of the substrate 1 using the vacuum deposition method is heated under inert gas atmosphere, thereby dispersing the vapor-deposited film as a cluster. Therefore, according to the method for manufacturing the organic EL element, the organic EL element that is able to improve the light extraction efficiency can be provided. Further, according to the method for manufacturing the organic EL element, the cores 22 in which there are few impurities can be formed, and the electrical property of the first electrode 2 can be stabilized.

Further, in the method for manufacturing the organic EL element, when formed by using the crystal growth method in which the crystal growth is performed under vacuum or inert gas atmosphere after the formation of the cores 22, the columnar bodies 23 can be formed as a single crystal being of high purity and having less defects. Therefore, the electrical property of the first electrode 2 can be stabilized.

Although the present invention has been described with reference to certain preferred embodiments, numerous modifications and variations can be made by those skilled in the art without departing from the true spirit and scope of this invention, namely claims.

The invention claimed is:

1. An organic EL element, comprising:
a substrate;
a first electrode formed at one surface side of the substrate;
a second electrode opposing the first electrode; and
an organic EL layer located between the first and second electrodes,
wherein the second electrode is a transparent electrode, the first electrode being a reflecting electrode, and
wherein the first electrode comprises a plurality of nanometer-size columnar structures formed on the one surface of the substrate, each of the plurality of columnar structures having a metallic surface as the outermost surface,
wherein each of the plurality of columnar structures comprises:
a core formed of a first organic semiconductor material;
a columnar body formed of a second organic semiconductor material, and selectively installed upright on the core; and
a first metallic thin film covering the core and the columnar body installed upright on the core,
wherein the first electrode comprises: first metallic thin films of the plurality of columnar structures; and a second metallic thin film formed on the one surface of the substrate so as to be continuously coupled to the first metallic thin films, and
wherein the first metallic thin films and the second metallic thin film are formed of the same materials.

2. The organic EL element according to claim 1,
wherein the substrate is provided at the one surface side with a conductive layer formed in a projection area for a thickness direction of the first electrode, and the conductive layer being electrically connected to the first electrode.

3. A method for manufacturing the organic EL element according to claim 1, comprising:
forming, at the one surface side of the substrate, the first electrode, the organic EL layer, and the second electrode sequentially;

forming cores of the plurality of columnar structures at the one surface side of the substrate, and then forming columnar bodies of the plurality of columnar structures, and then forming the first and second metallic thin films, in order to form the first electrode; and heating, under inert gas atmosphere, a vapor-deposited film formed of the first organic semiconductor material at the one surface side of the substrate using a vacuum deposition method, thereby dispersing the vapor-deposited film as a cluster, in order to form the cores.

4. A method for manufacturing the organic EL element according to claim 2, comprising:

forming, at the one surface side of the substrate, the first electrode, the organic EL layer, and the second electrode sequentially;

forming cores of the plurality of columnar structures at the one surface side of the substrate, and then forming columnar bodies of the plurality of columnar structures, and then forming the first and second metallic thin films, in order to form the first electrode; and heating, under inert gas atmosphere, a vapor-deposited film formed of the first organic semiconductor material at the one surface side of the substrate using a vacuum deposition method, thereby dispersing the vapor-deposited film as a cluster, in order to form the cores.

5. The method according to claim 3,
wherein forming of the columnar bodies is performed using a crystal growth method.

6. The method according to claim 4,
wherein forming of the columnar bodies is performed using a crystal growth method.

* * * * *